United States Patent [19]

Hales et al.

[11] Patent Number: 5,151,303
[45] Date of Patent: Sep. 29, 1992

[54] METHOD AND APPARATUS FOR USING EVACUATED, DETACHABLE WEB CONTAINERS WITH HIGH VACUUM TREATING MEANS

[75] Inventors: Crispin Hales, Winnetka; Thomas E. Zabinski, Orland Park, both of Ill.

[73] Assignee: IIT Research Institute, Chicago, Ill.

[21] Appl. No.: 564,023

[22] Filed: Aug. 7, 1990

[51] Int. Cl.$^5$ .................... B05D 3/00; C23C 14/56
[52] U.S. Cl. .................... 427/178; 427/295; 118/50; 118/718; 118/719; 118/733
[58] Field of Search ............ 427/178, 295, 177, 294, 427/296; 118/718, 719, 733, 235, 50

[56] References Cited

U.S. PATENT DOCUMENTS

| | | | |
|---|---|---|---|
| 2,907,679 | 10/1959 | Smith, Jr. | 428/333 |
| 3,401,249 | 9/1968 | Schleich et al. | 219/69 |
| 3,990,390 | 11/1976 | Plyshevsky et al. | 118/719 X |
| 4,664,062 | 5/1987 | Kamohara et al. | 118/719 |

FOREIGN PATENT DOCUMENTS 63-26365  2/1988  Japan .
2-82771   6/1990  Japan ..

*Primary Examiner*—Evan Lawrence
*Attorney, Agent, or Firm*—Fitch, Even, Tabin & Flannery

[57] ABSTRACT

A coiled metal sheet is placed in a container, which may be thereafter evacuated slowly with the strip outgassing, and then the highly evacuated container is sealed with the coiled strip therein. The evacuated container may be stored until ready to be mated with a high vacuum process chamber. The container is brought to the vacuum processing chamber and is connected thereto; and the coiled strip is unwound from the container and passed through the vacuum chamber, where it is treated while under a high vacuum. The treated strip is then preferably wound in a highly evacuated take-up container.

2 Claims, 1 Drawing Sheet

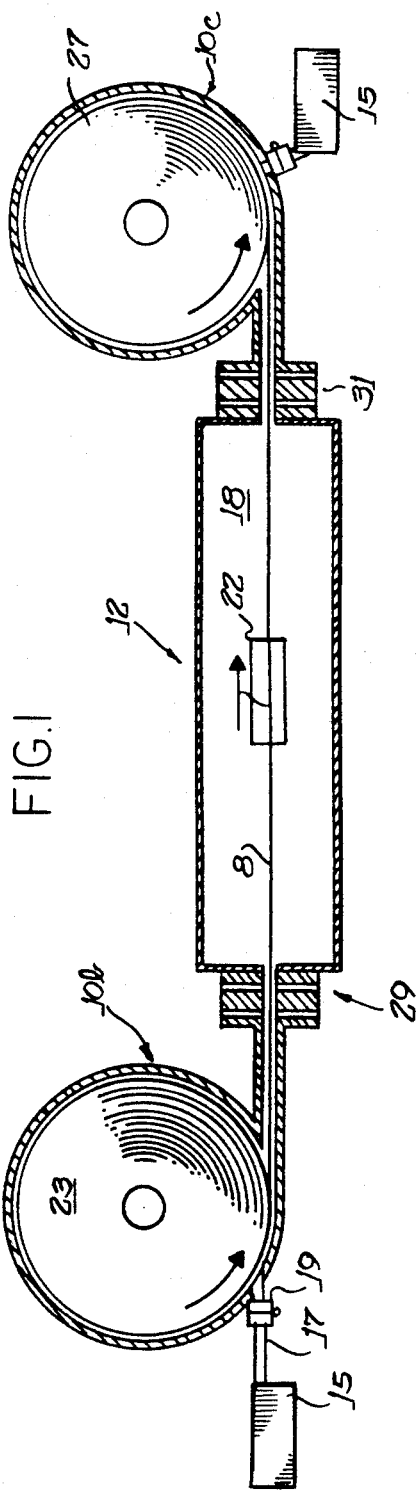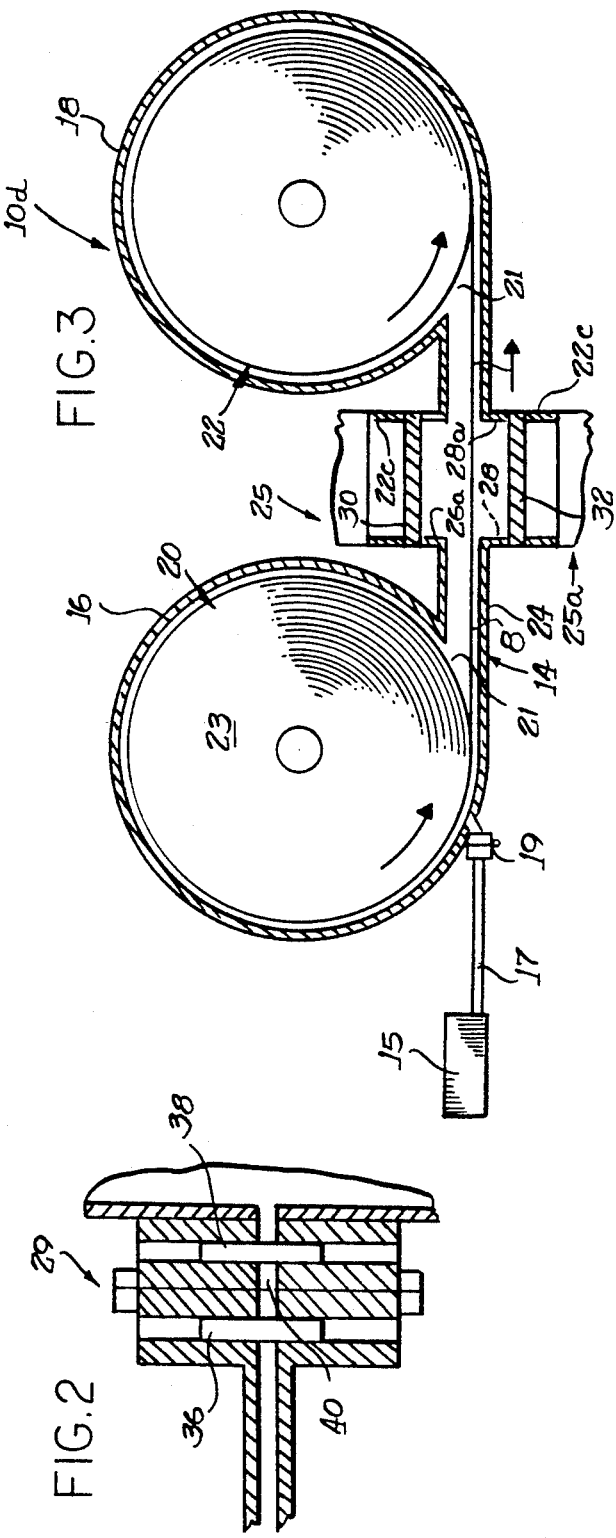

METHOD AND APPARATUS FOR USING EVACUATED, DETACHABLE WEB CONTAINERS WITH HIGH VACUUM TREATING MEANS

BACKGROUND OF THE INVENTION

This invention relates to a vacuum sealing system for use in the continuous vacuum deposition of thin films on an elongated substrate such as metal strips.

This invention pertains to the maintenance of a high vacuum, of about $10^{-6}$ torr, used in the coating of an elongated substrate such as metal strips. The invention is not limited to a metal strip as the substrate being coated may be of other material. The deposition can be accomplished by such means as, vacuum deposition using an electron beam gun, sputter coating, or any other suitable method which requires a high vacuum.

The production and maintenance of this very low vacuum necessary in these processes is time consuming and expensive. The pumping apparatus must remove several sources of gas in order to maintain the vacuum. As the coating materials are consumed, they liberate gas that must be removed by the vacuum pumps. Outgassing of the substrate and the apparatus' structural materials can pose a significant source of gas which must be removed. Additionally, gasses that leak into the system must be removed.

The high vacuum is required to ensure a uniform and even coating with little impurities. The high vacuum ensures that the molecules travel in a straight line from their source, thereby allowing accurate control and uniformity of the coating. The vacuum also reduces the likelihood of chemical reactions, such as oxidation, occurring between the coating substance and the atmospheric gases.

The problem is further complicated where it is desired to employ a continuous deposition process for metal strips moving through the high vacuum deposition station. In these types of system the gasses from leakage into the system may be significant and complex dynamic seals usually must be used to obtain an acceptable vacuum. Heretofore, for continuous strip deposition there have been a large number of vacuum chambers or areas between seals in order to isolate the very high vacuum chamber at which the deposition occurs.

These prior apparatus utilized a large number of vacuum stages connected in series and the stages are evacuated using large capacity vacuum pumps to establish and maintain the vacuum. U.S. Pat. No. 2,907,679 by H. R. Smith, Jr. discloses the coating of continuous metal sheet with an adherent layer, and uses a several vacuum chambers connected in series, each connected to a large capacity vacuum pump. These systems were difficult and costly to operate at the high vacuum necessary, due to the difficulty of properly sealing the substrate without damaging it and the cost of operating and maintaining the vacuum pumps and the apparatus. In particular, the time required to reestablish the vacuum after replacing the supply of substrate substantially increased the cost of such coatings. The expense involved in changing the substrate, prevented specialty products utilizing unique substrate from being commercially feasible.

The currently disclosed invention solves the above problems and contains advantages over the prior art that will be evident to one skilled in the art. The invention has the advantage of providing a vacuum evacuated container in which to store the newly formed product; this aids in reducing corrosion of the newly formed product. The coated substrate can therefore be safely stored for later application of a protective coating or other treatment.

In general, the object of the device is to provide a new and improved apparatus and method for feeding and sealing with strips or webs that receive a continuous vacuum deposition of thin films thereon.

SUMMARY OF THE INVENTION

This invention involves the use of highly evacuated, detachable containers having coiled webs therein which are sealed and brought in sealed interengagement with a high vacuum treating means. More specifically, a coiled substrate, such as a coiled metal sheet, may be placed in the container which is then evacuated and sealed at a high vacuum. The container may then be stored until ready to be mated to the high vacuum process chamber(s). One advantage of using the evacuated containers is that they may be evacuated over a period of time to reduce the later outgassing that occurs in the process chamber. When desired, the container(s) and the high vacuum process chamber(s) may be mated utilizing suitable seals to prevent the loss of vacuum.

One embodiment of the invention uses separate cartridges that are mated in pairs, one loaded and one empty, to the high vacuum process chamber. The cartridges and the process chamber are connected utilizing a vacuum-lock system to prevent loss of vacuum in either the cartridges or the process chamber. The vacuum-lock system consists of gate type seals located on both the cartridges and the vacuum chamber. A cartridge and the processing chamber are connected and the space between the two gate seals is evacuated to high vacuum the gate seals are opened, this ensures that no vacuum is lost during the connection process. The full cartridge may be sealed with a tab of the elongated substrate protruding. This would facilitate handling of the substrate once the cartridge is connected to the process chamber. This invention allows for the changing of the coils of substrate easily without loss of vacuum and additionally provides for storage of the coiled, processed substrate in a protected environment until shipped or further processed. A further advantage of the apparatus is its simple, modular, and flexible design. The apparatus does not require dynamic seals. The apparatus may be designed so that several different processing steps contain standardized connectors, thereby enabling the connection of the cartridges to a variety of processing apparatus. The substrate could undergo several processing steps with a minimum amount of contact with the substrate.

In another embodiment of the invention, there is only one container. The container is in the form of a cassette, with two cylindrical sections where the dispensing and take-up reels are placed. Between the cylindrical sections is a flat area that contains flanged windows that mate with the vacuum process chambers. The cartridge is loaded with a full substrate reel. The elongated substrate is then connected to the take up reel. The entire container is evacuated to produce a high vacuum in preparation for connection to the vacuum process chambers. The flanged windows, above and below the substrate in the straight section of the cassette, are mated with the process equipment contained in two retractable high vacuum chambers. A vacuum-lock system is used to accomplish the mating without loss of vacuum in the container or the process chambers. Like the cartridge system, the cassette system provides a storage container and it is readily adaptable to modular processing where the substrate undergoes a variety of processing steps while contained in the cassettes.

BRIEF DESCRIPTION OF THE DRAWINGS

FIG. 1 is a sectioned view of a cartridge embodiment of the present invention;

FIG. 2 is a sectioned view of a cassette embodiment of the present invention;

FIG. 3 is an expanded view of the vacuum-lock system of FIG. 2.

DETAILED DESCRIPTION OF PREFERRED EMBODIMENTS

The invention is directed to a system for handling coiled elongated substrates which hereinafter will be referred to as metal strips 8. These metal strips are to be treated with a deposition of a coating material under a very high vacuum of about $10^{-6}$ torr. The strip is treated by a treating means 22 usually having a crucible containing a coating material in a high vacuum chamber 18 within an enclosing housing 12 that has been suitably evacuated.

Heretofore, the strip was unwound from a reel which was located at the exterior of the high vacuum housing 12 in which was a centrally located high vacuum chamber 18 with the treating means 22 located therein. In conventional systems, a series of sealed chambers each with entrance and exit seals and pumps for pumping down the vacuum were used to seal against gasses reaching the innermost high vacuum chamber where the deposition takes place.

In accordance with the present invention, the metal strip 8 is mounted in an evacuated container means 10 which may, e.g., include a pair of separate dispensing reel cartridge 10b and a take-up reel cartridge 10c (FIG. 1) or the evacuated container means may include a cassette 10d having an attached dereeler housing 16 and take-up reel housing 18 (FIG. 3). The cartridge or cassette containers are adapted to be connected to a vacuum pump means 15 which is shown diagrammatically in FIG. 3 as being connected by a conduit 17 through a valve 19 to the interior chamber 21 within the cassette housing 14. The pump means 15 can be operated for a long period of time, e.g., overnight to evacuate the cassette housing and to outgas a coil 23 of metal strip contained in the cassette being evacuated.

The cassette housing 14 includes two generally circular sections 16 and 18 that contain the dereeler 20 and the take-up reel 27, and an intermediate, flat joining section 24 at which a processing or treating means 22 in a high vacuum chamber 18 coats the strip.

A full reel of metal strip is inserted through a door provided in the cassette reel section 16 and is mounted on the dereeler 20 for rotation. The cassette is evacuated to a vacuum of about $10^{-6}$ torr before being connected to the vacuum process treating means 22 which may include a pair of retractable chambers 25 and 25a. The untreated strip is unwound from the dereeler 20 and is passed through the intermediate section and initially connected to the take-up reel 27.

The cassette housing 14 is connected to the pump means 15 and is highly evacuated over a long period of time. The strip may be outgassed considerably while in the cassette housing which is a sealed housing. The valve or seal means 19 may be closed to allow disconnection of the evacuated cassette which is then carried to the high vacuum processing treating station at which are located the treating chambers 25 and 25a.

The cassette housing includes windows 26 and 28 in the intermediate section 24 of the housing 14 for connection to the treating chambers 25 and 25a to allow access for the deposition of the coating from the treating chambers onto the strip. As illustrated, the windows 26 and 28 have encircling flanges 26a and 28a which mate with flanged windows 22c on the retractable chambers 25 and 25a. Herein, the flanged windows are provided on the intermediate section above and below the plane of the metal strip 8. The retractable vacuum process chambers 25 and 25a are mated to the flat intermediate section by means of vacuum-lock and seal systems 30 and 32. The vacuum lock systems utilizes clamp seals to seal the retractable vacuum process chambers 25 and 25a to be attached and detached without the loss of vacuum in the cassette housing 14 or in the treating chambers 25 and 25a. The metal strip is treated as it passes through that section of the cassette where the retractable process chambers are connected. The treated substrate passes out of the flat section of the cassette and is wound on the take-up reel 27.

The container cartridge is shown in FIG. 1 and includes a pair of separate, discreet detachable cartridges 10b and 10c, which are mated with a high vacuum process housing 12. The cartridges are mated by using vacuum lock systems 29 and 31 to to prevent the loss of vacuum when connecting or disconnecting an evacuated cartridge to the high vacuum process chamber 18 in the housing 12.

An expanded view of the vacuum-lock system used to mate a cartridge 10b or 10c to the high vacuum process housing 12 is shown in FIG. 2. Preferably, the cartridges are mated to the high vacuum process chamber by a clamp and seal means which includes gate seals 36 and 38, located on the cartridges and the vacuum chamber housing, respectively. The gate seals are initially closed when the cartridge and the vacuum chamber are connected. The area or space 40 between the seals 36 and 38 is evacuated to a high vacuum before the seals 36 and 38 are opened. This ensures that no vacuum is lost during connection of the cartridges and the process chamber.

The operation of the system is as follows. A full coil 23 is mounted in the dereeler cartridge 10b through a door provided in the cartridge. A pumping means 15 connected by a conduit 17 is connected through a valve to both the dereeler cartridge and to the take-up reel cartridge 10c. Each of these cartridges is evacuated to a vacuum of about $10^{-6}$ torr. After evacuation, the valves 19 are closed and each cartridge is disconnected from the pumping means and is transported to the deposition housing 12. The cartridges 10 are connected to the high vacuum process housing. The spaces 40 between the two closed gate valves are evacuated to a high vacuum of about $10^{-6}$ torr. The gate seals 36 and 38 may now be opened without losing vacuum in the process chamber 12 or in the cartridges 10b or 10c.

The strip 8 is wound on the coil 22 in the take-up cartridge. After completion of the deposition coating process, the gate valves and the gate seals 36 and 38 may be closed to seal the vacuum of the high vacuum chamber 18 and to seal the vacuum in the respective cartridges 10b and 10c which then can be removed from the housing 12.

While it is preferred to evacuate either the cartridges or the cassettes prior to attachment to the process treating housing, it is possible to connect the same to the housing and then proceed to evacuate the cartridges or cassettes.

What is claimed is:

1. An apparatus for coating a strip or web in a high vacuum system operating in a high vacuum range of about $10^{-6}$ torr comprising:

container means having a dispensing reel compartment for dispensing a coiled strip and a take-up reel compartment for winding the strip into a coil;

said container means being substantially airtight and having means for being evacuated with the coiled strip therein;

means for treating the strip while at the high vacuum;

means for connection of said container means while under evacuation with said means for treating the strip without loss of the high vacuum at the treating means and at the container means;

said container means including two discrete cartridges, a first cartridge having the dispensing reel compartment, and a second cartridge having the take-up compartment.

2. A method of treating a strip of metal within a high vacuum in the range of about $10^{-6}$ torr, said method comprising the steps of:

providing a cartridge housing a coil of metal strip therein;

evacuating the cartridge housing with the coil strip therein;

connecting the evacuated cartridge housing to a treating housing having the high vacuum therein;

providing a take-up cartridge housing for coiling a treated strip;

evacuating the take-up cartridge housing and attaching the evacuated take-up housing to the treating housing which has a high vacuum therein;

processing the strip while in a high vacuum by a treating means in the treating housing; and unwinding the coiled strip in the cartridge housing and coiling the treated strip in the evacuated take-up cartridge housing.

* * * * *